United States Patent
Pfirsch et al.

(10) Patent No.: US 6,815,769 B2
(45) Date of Patent: Nov. 9, 2004

(54) POWER SEMICONDUCTOR COMPONENT, IGBT AND FIELD-EFFECT TRANSISTOR

(75) Inventors: Frank Pfirsch, München (DE); Carsten Schäffer, Treffen Bei Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/352,825

(22) Filed: Jan. 28, 2003

(65) Prior Publication Data

US 2003/0160270 A1 Aug. 28, 2003

(30) Foreign Application Priority Data

Jan. 28, 2002 (DE) .......................................... 102 03 164

(51) Int. Cl.$^7$ .............................................. H01L 29/76
(52) U.S. Cl. ...................................... 257/341; 257/331
(58) Field of Search ................................ 257/341, 331, 257/330, 332, 333, 401, 502

(56) References Cited

U.S. PATENT DOCUMENTS

| | | |
|---|---|---|
| 5,283,201 A | 2/1994 | Tsang et al. |
| 5,326,711 A | 7/1994 | Malhi |
| 5,329,142 A | 7/1994 | Kitagawa et al. |
| 5,448,083 A | 9/1995 | Kitagawa et al. |
| 5,585,651 A | 12/1996 | Kitagawa et al. |
| 5,801,417 A | 9/1998 | Tsang et al. |
| 5,894,149 A | 4/1999 | Uenishi et al. |
| 6,072,214 A | 6/2000 | Herzer et al. |
| 6,111,290 A | 8/2000 | Uenishi et al. |
| 6,150,675 A | 11/2000 | Franke et al. |
| 6,462,387 B1 * | 10/2002 | Lai ............................ 257/390 |
| 6,624,470 B2 * | 9/2003 | Fujishima ................... 257/331 |
| 2002/0179928 A1 | 12/2002 | Fujishima |

FOREIGN PATENT DOCUMENTS

| | | |
|---|---|---|
| DE | 196 51 108 C2 | 10/1997 |
| DE | 199 05 421 A1 | 8/2000 |
| DE | 100 38 177 A1 | 2/2002 |
| DE | 102 23 822 A1 | 12/2002 |
| EP | 0 813 250 A2 | 12/1997 |
| EP | 0 837 508 A2 | 4/1998 |
| EP | 0 847 090 A2 | 6/1998 |
| GB | 2 314 206 A | 12/1997 |
| JP | 05 007 002 A | 1/1993 |
| WO | WO 02/41404 | 5/2002 |

OTHER PUBLICATIONS

I. Omura et al.: "IGBT Negative Gate Capacitance and Related Instability Effects", *IEEE Electron Device Letters*, vol. 18, No. 12, Dec. 1997, pp. 622–6124.

Ichiro Omura et al.: "Oscillation Effects in IGBT's Related to Negative Capacitance Phenomena", *IEEE Transactions on Electron Devices*, vol. 46, No. 1, Jan. 1999, pp. 237–244.

\* cited by examiner

*Primary Examiner*—Eddie Lee
*Assistant Examiner*—Douglas W. Owens
(74) *Attorney, Agent, or Firm*—Laurence A. Greenberg; Werner H. Stemer; Gregory L. Mayback

(57) ABSTRACT

A trench power semiconductor component, in particular an IGBT, has an electrode (4) in a trench (3) that is laterally divided into a section (10) that serves as a gate and a section (11) that is connected to the source metallization (6). A method for making the trench power semiconductor component is also included.

28 Claims, 17 Drawing Sheets

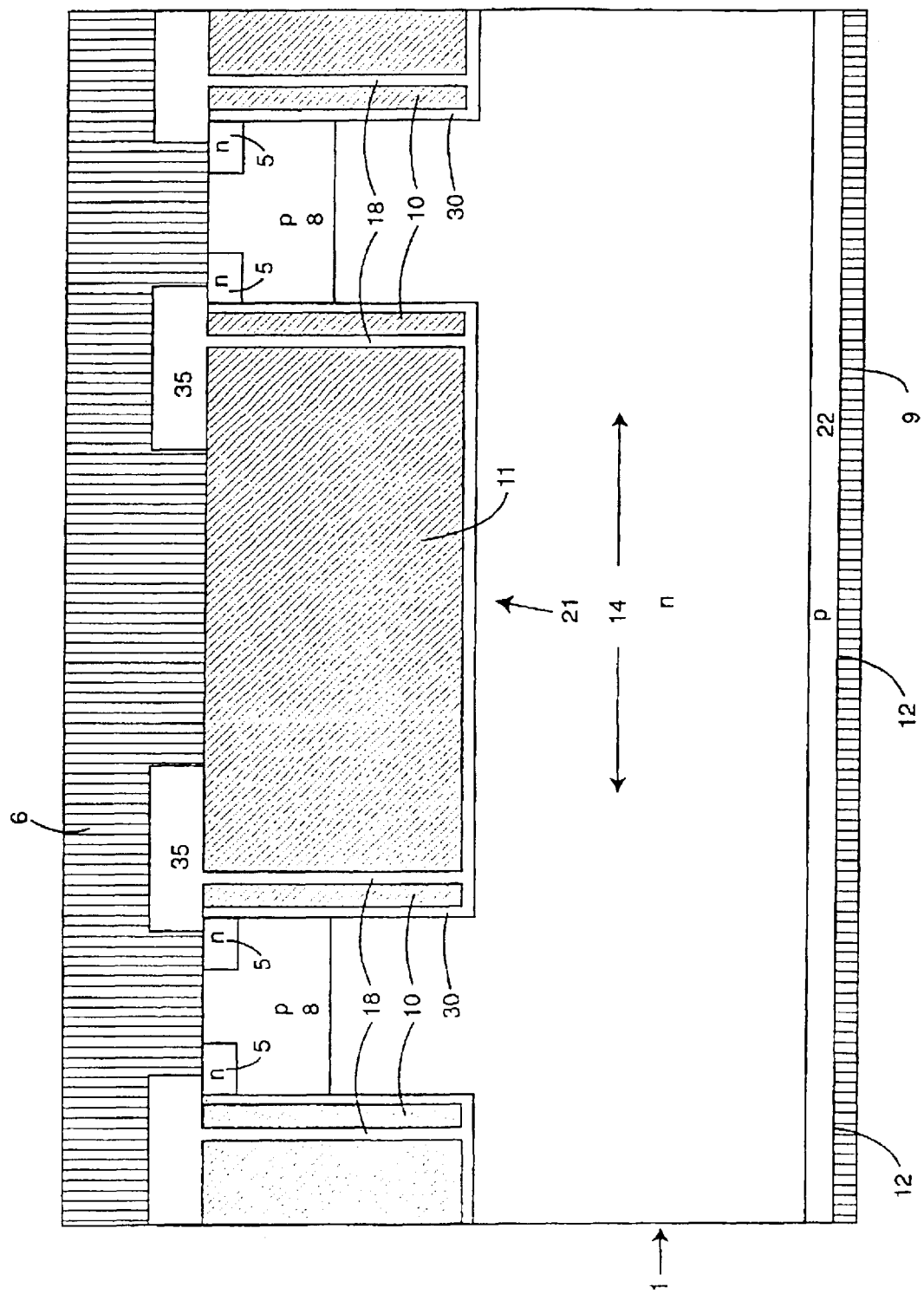

PRIOR ART

PRIOR ART

PRIOR ART

POWER SEMICONDUCTOR COMPONENT, IGBT AND FIELD-EFFECT TRANSISTOR

BACKGROUND OF THE INVENTION

Field of the Invention

The present invention relates to a power semiconductor component. The power semiconductor component has a semiconductor body. Into one surface of the semiconductor body, a trench is introduced. An electrode device is provided in the trench. A first semiconductor zone of a first conductivity type that adjoins the trench is provided with a first metallization. The first metallization is provided on the surface of the semi-conductor body and is separated from a second semiconductor zone of the first conductivity type by a third semiconductor zone of the second conductivity type, opposite to the first conductivity type, which adjoins the trench. The second semiconductor zone adjoins the lower region of the trench. A power semiconductor component of this type may, for example, be an IGBT (insulated gate bipolar transistor), a special variant of an IGBT, namely an IEGT (injection enhanced gate transistor) or a field-effect transistor. The present invention also relates to a method for fabricating a power semiconductor component of this type.

In IGBTs, the reverse transfer capacitance, i.e. the gate-collector capacitance, which is also known as Miller capacitance, has a significant influence on the on and off switching performance of the component and on its stability in the event of a short circuit. Specifically, a high reverse transfer capacitance leads to longer switching operations and therefore increased switching losses. Moreover, in the event of a short circuit, a capacitance having a negative effect may be produced; this can result in unstable component behavior. An unstable behavior of this type manifests itself, for example, in an increased tendency to oscillate and an uncontrolled rising gate voltage and current (cf. also in this respect I. Omura et al.: IGBT Negative Gate Capacitance and Related Instability Effects, IEEE Electron device Letters, Vol. 18, No. 12, 1997, pages 622–624, and I. Omura et al.: Oscillation Effects in IGBT's Related to Negative Capacitance Phenomena, IEEE Transactions on Electron Devices, Vol. 46, No. 1, 1999, pages 237–244). It has been found that this undesirable effect of a negative capacitance can in principle be avoided by having a low ratio of the reverse transfer capacitance to the gate-source capacitance.

In a trench IGBT with an n-conducting source zone (or emitter zone), also known as n-source (or n-emitter) for short, a p-body zone, an n-base zone and a p-drain zone (or p-collector zone), especially in the case of a wide n-base zone which is constructed for relatively high voltages of above approximately 1200 V, the gate surface area that adjoins this n-base zone is large, so that there is inevitably also a very high reverse transfer capacitance with the drawbacks that have been outlined above. It should be noted at this point that for a field-effect or MOS transistor it is normal to speak of source, gate and drain, while in the case of an IGBT the corresponding connections are also known as the emitter, gate and collector.

In the following text, first of all the prior art relating to trench IGBTS with reduced reverse transfer capacitance is to be explained with reference to FIGS. 8 to 12.

FIG. 8 shows the basic structure of a trench IGBT (cf. also in this respect, by way of example, FIG. 1 of European Patent No. EP 0 847 090 A2, which corresponds to U.S. Pat. No. 6,072,214, and DE 19 651 108 A1, which corresponds to U.S. patent application Ser. No. 6,218,217B1, and U.S. Pat. Nos. 6,111,290A and 5,894,149A, or U.S. Pat. No. 5,894,149 or U.S. Pat. No. 6,111,290), having a semiconductor body 1, in which an n-base zone 7, a p-base or body zone 8, an n-source or emitter zone 5 and trenches 3 with a gate electrode 4, made, for example, from polycrystalline silicon and a gate insulation layer 30 surrounding this in the trench 3, as well as a p-drain or collector zone 22 are provided.

The conductivity types indicated may, of course, in each case be reversed. This applies in the same way to the following examples relating to the prior art and to the subsequent exemplary embodiments of the invention.

The semiconductor body 1 preferably is made from silicon. However, other semiconductor materials, such as for example SiC $A_{III}B_V$, etc. are also conceivable. Examples of dopants for n-type conductivity or p-type conductivity are phosphorus or boron. In this case, it is also possible to use other dopants. This applies in the same way to the following examples and to the exemplary embodiments of the invention.

On a first surface 2 of the semiconductor body 1, there is a source or emitter metallization 6, while on a second, opposite surface 12 of the semiconductor body 1 there is a drain or collector metallization 9. By way of example, aluminum or another suitable contact metal can be used for the metallizations 6, 9. It is also conceivable to use polycrystalline silicon.

The gate electrode 4 is electrically isolated from the metallization 6 by an insulation layer 35. By way of example, silicon dioxide and/or silicon nitride can be used for this insulation layer 35.

For relatively high reverse voltages, the variant of the IGBT that is known as an IEGT, has proven more favorable, because of its reduced forward voltage. IEGTs are described, for example, in U.S. Pat. Nos. 5,329,142, 5,448,083, and 5,585,651.

In these IEGTS, the basic principle involves making a relatively narrow current path available to the holes flowing via the body zones (cf. 8 in FIG. 8) to the front-surface contact (cf. 6 in FIG. 8), so that a high hole current density and therefore a high charge carrier gradient is established below the body zones. This high charge carrier gradient then leads to a high charge carrier flooding in the low-doped n-base zone (cf. 7 in FIG. 8). Since, in particular in the case of a thick n-base zone, i.e. with relatively highly blocking IGBTs, for voltages above approximately 1200 V the voltage drop in the n-base zone dominates the entire forward voltage, it is in this way possible to reduce the forward voltage of the IGBT despite the resistance which opposes the holes in the narrow current path. The narrow current path is generally produced by the fact that the trench IGBT cells are not disposed directly adjacent, but rather have a space between them (c.f. also in this respect British Patent No. GB 2 314 206 or European Patent No. EP 0 813 250 A2, EP 0 847 090 A2 (which corresponds to U.S. Pat. No. 6,072,214) and DE 19 651 108 A1 (which corresponds to U.S. patent application Ser. No. 6,218,217B1, and U.S. Pat. Nos. 6,111, 290 and 5,894,149). Specifically, in this respect, FIG. 9 shows an IEGT in which only every third strip of the strip-like trenches 3 contains source or emitter zones 5, while there are no source or emitter zones in the other strips, and the body zones 8 are not connected to the source metallization 6. FIG. 10 shows an IEGT in which the region between the active strips or cells provided with source or emitter zones 5 is filled by a floating p-region 16 that has defused deep into the n-base 7. FIG. 11 shows an IEGT which is similar to the IEGT shown in FIG. 10 but in which an intercell region 14 has been covered by polycrystalline silicon of the gate electrode 4, and FIG. 12 shows an IEGT that is similar to the IEGT shown in FIG. 11, but in this case the polycrystalline silicon of the gate electrode 4 in the intercell region 14 has a stepped profile, that contributes to a reduction in the reverse transfer capacitance.

Nevertheless, all the IEGTs shown in FIGS. 9 to 12 still have a high reverse transfer capacitance. The high reverse transfer capacitance is ultimately attributable to the large surface area of the gate insulation layer 30, which is not required for the MOS channel in the body zone 8.

The reverse transfer capacitance can be reduced in planar IGBTs (i.e. not in trench IGBTs) if the thickness of the gate insulation layer outside the actual channel region, i.e. outside the body zone, is increased (cf. European Patent No. EP 0 837 508 A2). By contrast, in trench IGBTs, the reverse transfer capacitance can be reduced if the electrode disposed in inactive trenches is connected not to the gate potential but rather to the emitter or front-surface potential (cf. DE 19 651 108 A1, which corresponds to U.S. patent app. Ser. No. 6,218,217 or U.S. Pat. No. 5,894,149 and U.S. Pat. No. 6,111,290). However, with a configuration of this type, a large proportion, for example half, of the polycrystalline silicon of the gate electrode is not available for the conductivity of this electrode, and consequently the effective gate resistance is increased undesirably.

U.S. Pat. No. 6,150,675 has disclosed a planar MOS transistor or IGBT in which part of the gate electrode is separated from and connected to the source metallization. Furthermore, U.S. Pat. No. 5,283,201 and U.S. Pat. No. 5,801,417 have disclosed trench transistors in which the lower part of the gate electrode in the trench is separated off and electrically insulated from the gate. In U.S. Pat. No. 5,326,711, a special form of the gate electrode is realized by electrodes in a trench that, in some cases, lie next to one another but are electrically connected to one another. Finally, DE 10 038 177 (which corresponds to PCT/EP 01/08718) shows an MOS transistor having electrodes in a trench that likewise only partially lie next to one another and can be connected to different potentials.

Hitherto, however, there has been no satisfactory solution approach allowing the reverse transfer capacitance to be reduced readily in trench IGBTs without having to accept drawbacks.

SUMMARY OF THE INVENTION

It is accordingly an object of the invention to provide a power semiconductor component, an IGBT, an IEGT, a field-effect transistor, and a method for fabricating the semiconductor component that overcome the hereinaforementioned disadvantages of the heretofore-known devices of this general type and that provide a power semiconductor component with a trench structure that is distinguished by a greatly reduced reverse transfer capacitance. Moreover, it is intended to provide a method for fabricating a power semiconductor component of this type.

With the foregoing and other objects in view, there is provided, in accordance with the invention, a power semiconductor component of the type described in the introduction but distinguished by the fact that the electrode device includes at least two electrodes which are electrically isolated from one another.

More specifically, a power semiconductor component is disclosed that has a semiconductor body, an electrode device, a metallization, and three semiconductor zones. The semiconductor body has a surface with a trench formed therein. The trench has a lower region. The electrode device is provided in the trench and has two electrodes that are electrically isolated from one another. The metallization is provided on the surface of the semiconductor body. The first semiconductor zone is of a first conductivity type, adjoins the trench, and is provided with the metallization. The second semiconductor zone is of the first conductivity type and adjoins the lower region of the trench. The third semiconductor zone is of a second conductivity type opposite to the first conductivity type, adjoins the trench, and separates the first semiconductor zone from the second semiconductor zone.

With the objects of the invention in view, there is also provided a method according to the invention that includes in particular the following method steps:

(a) etching at least one trench into a semi-conductor body,
(b) producing a gate insulation layer on the surface of the semiconductor body and of the trench,
(c) producing a polycrystalline silicon layer on the gate insulation layer,
(d) depositing a first layer of material that is suitable for masking the polycrystalline silicon layer,
(e) introducing a second layer of material, which is suitable for masking a subsequent etch of the first layer of material, at least in the lower part of the trench,
(f) removing the first layer of material in the region which is not masked by the second layer of material,
(g) removing the second layer of material,
(h) producing an insulating layer on the poly-crystalline silicon layer in the region which is not masked by the first layer of material,
(i) anisotropically etching the polycrystalline silicon layer in the region at the base of the trench which is not masked by the insulation layer,
(j) patterning the polycrystalline silicon layer,
(k) applying a further insulation layer,
(l) etching contact holes through the further insulation layer to the semiconductor body, and
(m) applying a metallization.

In the power semiconductor component with a trench structure according to the invention, which is in particular an IGBT and preferably an IEGT, a large proportion of the reverse transfer capacitance that is present with standard structures is replaced by a source-drain capacitance as a result of the gate electrode device being divided into at least two electrodes which are electrically isolated from one another. Therefore, a change in the drain voltage has only a slight effect on the gate.

The reverse transfer capacitance, which has been considerably reduced in this way, leads to improved controllability of the power semiconductor component and makes it easier to deal with faults, such as for example a short circuit. One advantage, especially compared to the power semiconductor component that is known from DE 19 651 108 A1 (which corresponds to U.S. Pat. Nos. 5,894,149 and 6,111,290), is that only half the area of body zone is required to achieve the same active channel width. In addition to this direct saving on the surface area, therefore, the improved hole accumulation effect also results in a higher charge carrier flooding in the bulk of the semiconductor body and therefore a lower forward voltage.

It is therefore essential to the power semiconductor component according to the invention that the electrode device located in the trench is substantially laterally divided into a part that is connected to the gate and a part that is connected to the source, these two parts being electrically isolated from one another. The two parts may be formed of polycrystalline silicon, and the insulation layer provided between them in order to isolate them may, for example, be made from silicon dioxide and/or silicon nitride or from a plurality of films that are preferably formed from these materials.

The electrode device provided in the trench therefore includes an electrode that is connected to the gate connection and an electrode that is connected to the source metallization. The electrode that is connected to the gate connection extends at least to the depth of the underside of the body zone and preferably substantially as far as the bottom of the trench. The electrode that is connected to the source metallization may have a section that overlaps an intercell region. In this case, the electrode that is connected to the source is preferably connected to the source metallization in this intercell region.

Furthermore, the electrode that is connected to the gate may have a section that at least partially overlaps the electrode that is connected to the source.

The power semiconductor component according to the invention preferably has a strip structure. This means that the trenches extend in strips in the semiconductor body that run substantially parallel to one another. Another possible option for the structuring of the power semiconductor component is for the individual cells or the third semiconductor zones to be in the shape of a square, hexagon or polygon, when seen from above. In this case, the trench and the electrode device laterally surround the third semiconductor zone.

Furthermore, a floating region, i.e. a region with which electrical contact is not made, may be provided in the intercell region. It is also possible to provide an additional trench in the intercell region.

Furthermore, one of the two electrodes may be connected to the gate connection of the power semiconductor component, while the other electrode is connected to an independent connection that is isolated from the gate and source.

In particular, steps (d) to (i) are important in the method according to the invention, since they can be used to isolate the electrode connected to the gate and the electrode connected to the source without the need for an additional photographic technique.

The further polycrystalline silicon layer, which is preferably used to fill the trench, can additionally be used for connection to the gate electrode. For this purpose, the further polycrystalline silicon layer has to be connected to the first polycrystalline silicon layer in an electrically conductive manner.

Other features that are considered as characteristic for the invention are set forth in the appended claims.

Although the invention is illustrated and described herein as embodied in a power semiconductor component, an IGBT, an IEGT, a field-effect transistor, and a method for fabricating the semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a sectional view through a trench IGBT (IEGT) in accordance with a further exemplary embodiment of the present invention;

DESCRIPTION OF THE PREFERRED EMBODIMENTS

Figure 1:
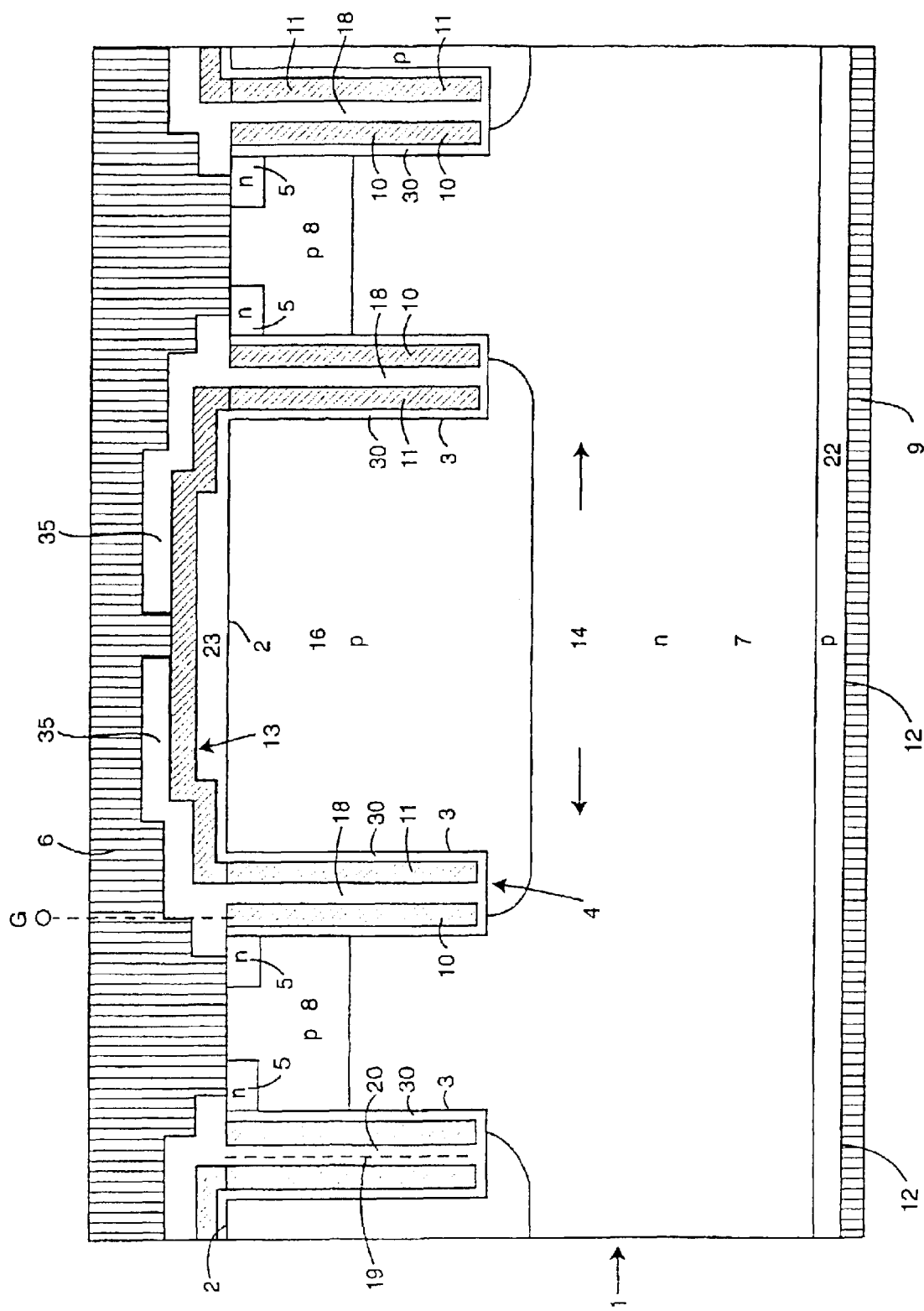
FIG. 1 is a sectional view through a trench IGBT (IEGT) in accordance with a first exemplary embodiment of the present invention.

FIGS. 8 to 12, which involve the prior art, have already been explained in the Background of the Invention.

In all the figures of the drawing, sub-features and integral parts that correspond to one another bear the same reference symbol in each case.

Referring now to the figures of the drawings in detail and first, particularly to FIG. 1 thereof, there is shown a section through an IEGT in accordance with a first exemplary embodiment of the present invention.

Unlike in the conventional IEGTs shown in FIGS. 8 to 12, in this case, an electrode device 4 is formed from two parts, namely a first electrode 10 connected to a gate connection G and a second electrode 11 connected to a source metallization 6. The two electrodes 10, 11 are disposed laterally next to one another and substantially parallel to one another in the respective trenches 3. The electrode 10 is adjacent to the source zone 5 and the body zone 8 and is electrically isolated from these zones by a gate insulation layer 30.

The electrode 11, which is connected to the source metallization 6 via an insulation layer 23, in the event of changes to the voltage at a drain metallization 9, is responsible for most of the reverse transfer and therefore screens gate G from these changes. The insulation layer 23 is preferably a thick oxide which has been produced by thermal oxidation at the start of the process, is important in particular in the edge region of a chip and may, but does not have to, be present in the cell region.

A strip structure from the trenches 3 and therefore for the electrode device 4 is particularly advantageous, because it is then possible for a gate connection G for the electrode 10 to be disposed at the end of the corresponding strip, i.e. in the end region of the electrode 10, before or behind the plane of the drawing, as indicated by dashed lines in FIG. 1.

Connection to the source metallization 6 is preferably produced in an intercell region 14 by a thick oxide (silicon dioxide) that forms an insulation layer 35. The electrode device is preferably of stepped configuration in this intercell region 14.

An insulation layer 18 that electrically isolates the two electrodes 10, 11 from one another preferably is formed of silicon dioxide (SiO$_2$) or silicon nitride (Si$_3$N$_4$) or of a plurality of layers 19, 20 (cf. the left-hand trench 3 in FIG. 1), at least one of which is made from silicon dioxide and at least one of which is made from silicon nitride.

For electrodes 11 of two adjacent cells that face one another, the connection of the electrodes 11 to the source metallization 6 may be effected jointly, as shown in FIG. 1.

Figure 2:
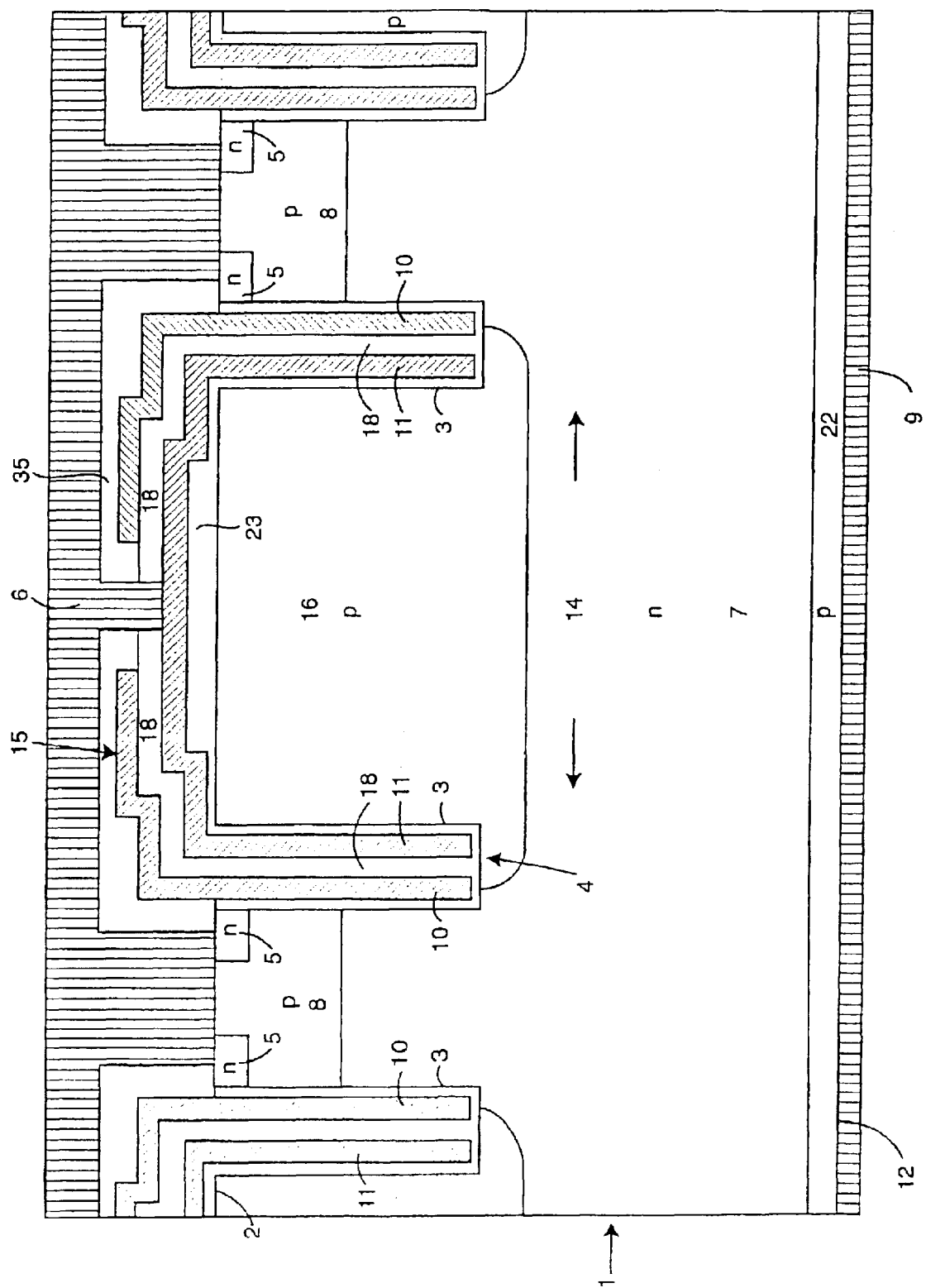
FIG. 2 is a sectional view through a trench IGBT (IEGT) according to a second exemplary embodiment of the present invention.

FIG. 2 shows a section through an IEGT in accordance with a second exemplary embodiment of the present invention. This exemplary embodiment substantially corresponds to the exemplary embodiment shown in FIG. 1. In this case, however, the insulation layer 18 and the electrode 10 additionally partially overlap the electrode 11 connected to the source metallization 6 in the intercell region 14. However, the extent of the overlap must only be such that the electrodes 11 can still be connected to the metallization 6 in such a manner that they are electrically isolated from the electrodes 10. What this means is that for this connection only one opening, which is square for example, has to be provided in the electrode 10, in which opening the connection of the source metallization 6 to the electrodes 11 is effected, this connection being electrically isolated from the electrodes by the thick oxide of the insulation layer 35.

An IEGT having the structure of the exemplary embodiment shown in FIG. 2 is particularly advantageous if, by way of example, square cells are used to construct the power semiconductor component instead of strips.

Figure 3A:
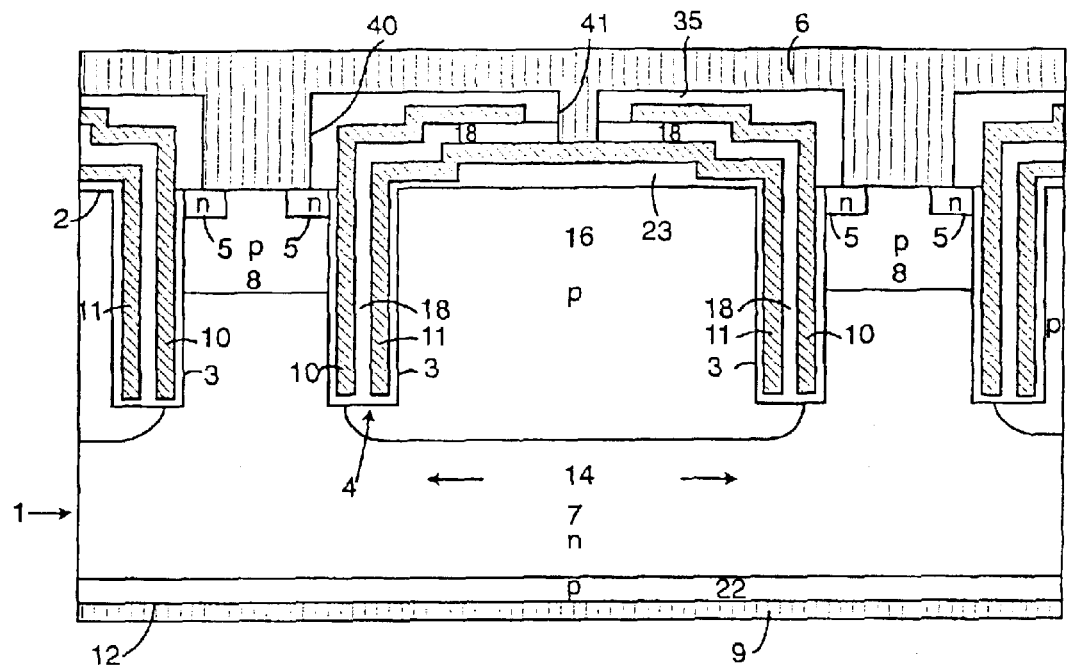
FIGS. 3A and 3B respectively are a sectional view through a plan view of a trench IGBT (IEGT) in accordance with the second exemplary embodiment of the present invention.
Figure 3B:
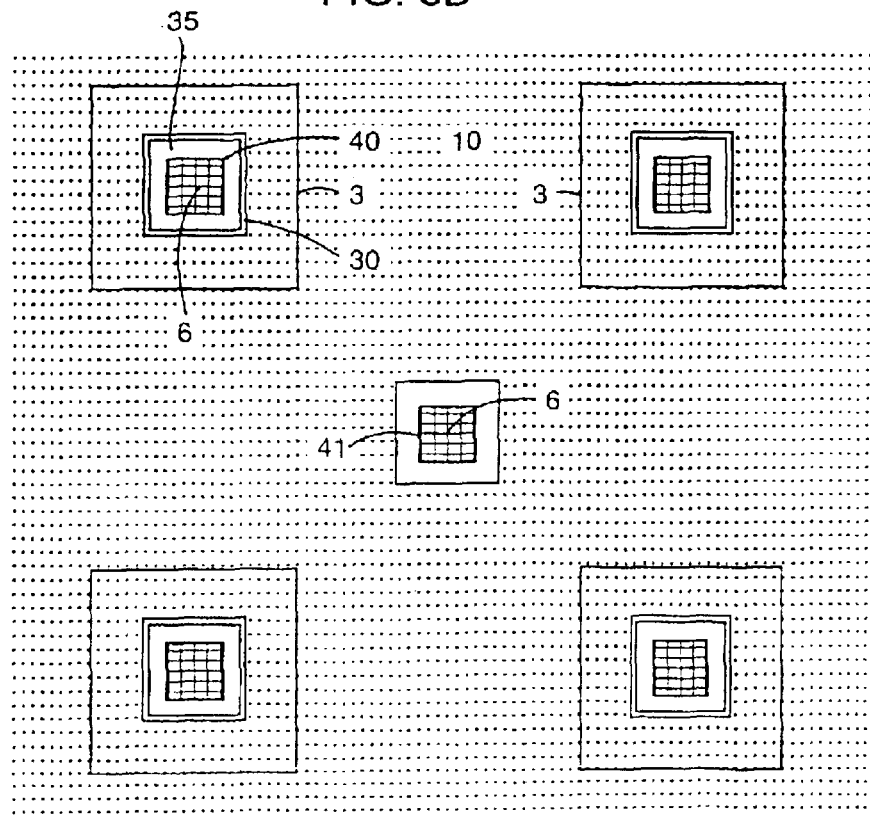

FIGS. 3A and 3B show a specific exemplary embodiment with square cells. FIG. 3A is a sectional illustration corresponding to FIG. 2 and FIG. 3B represents a plan view. In this exemplary embodiment, therefore, the electrode 10, which is connected to the gate, overlaps the electrode 11 that is connected to the source.

In the plan view shown in FIG. 3B, only the structures of the trenches 3, of the polycrystalline silicon for the electrodes 10 connected to a gate, of the gate insulation layer 30, of the insulation layer 35 and of contact holes 40, 41 with the source metallization 6 engaging through them are illustrated.

Figure 4:
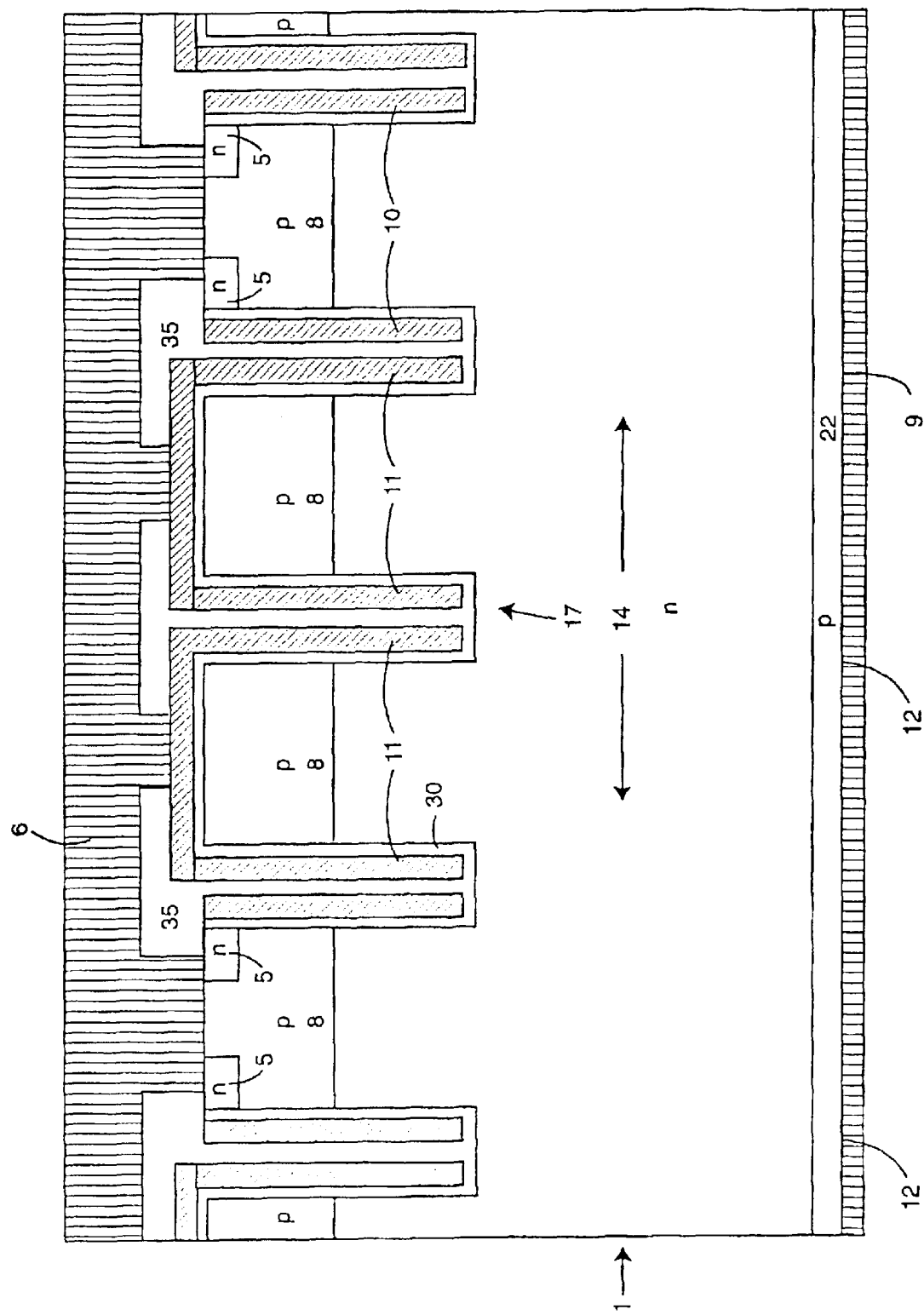
FIG. 4 is a sectional view through a trench IGBT (IEGT) in accordance with a third exemplary embodiment of the present invention.
Figure 9:
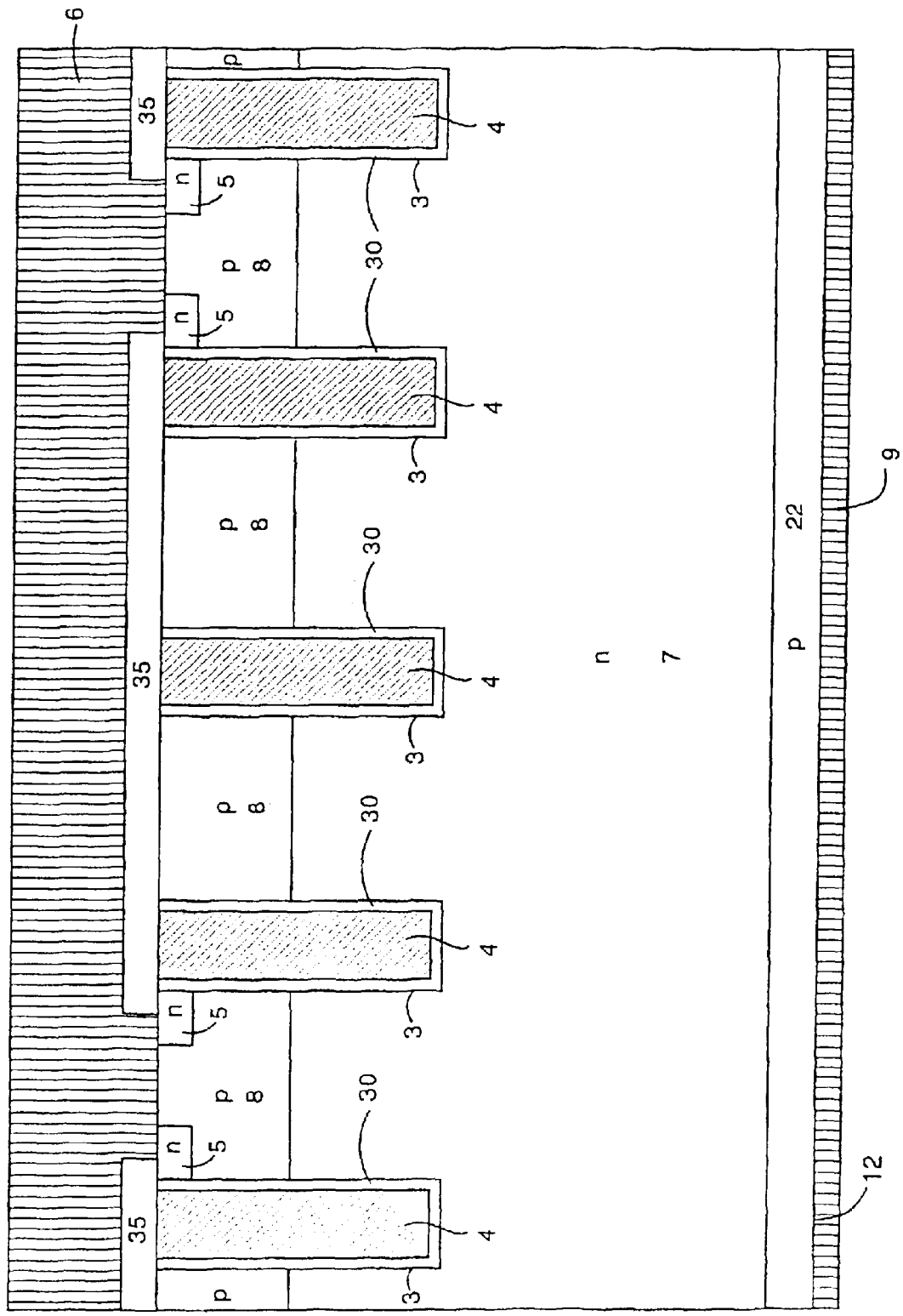
FIGS. 9 to 12 are sectional views through prior-art trench IGBTs (IEGTs).
Figure 10:
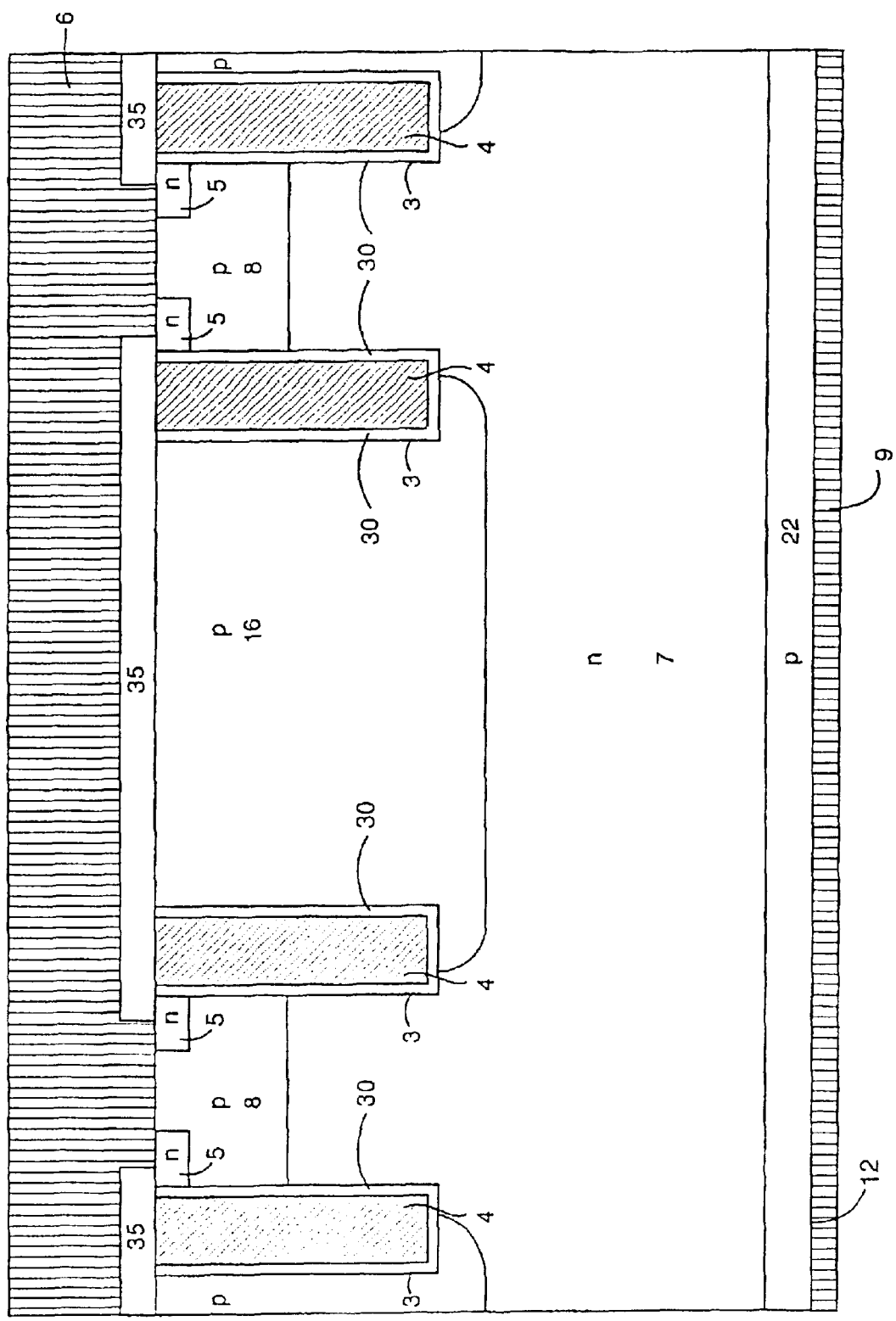
Figure 11:
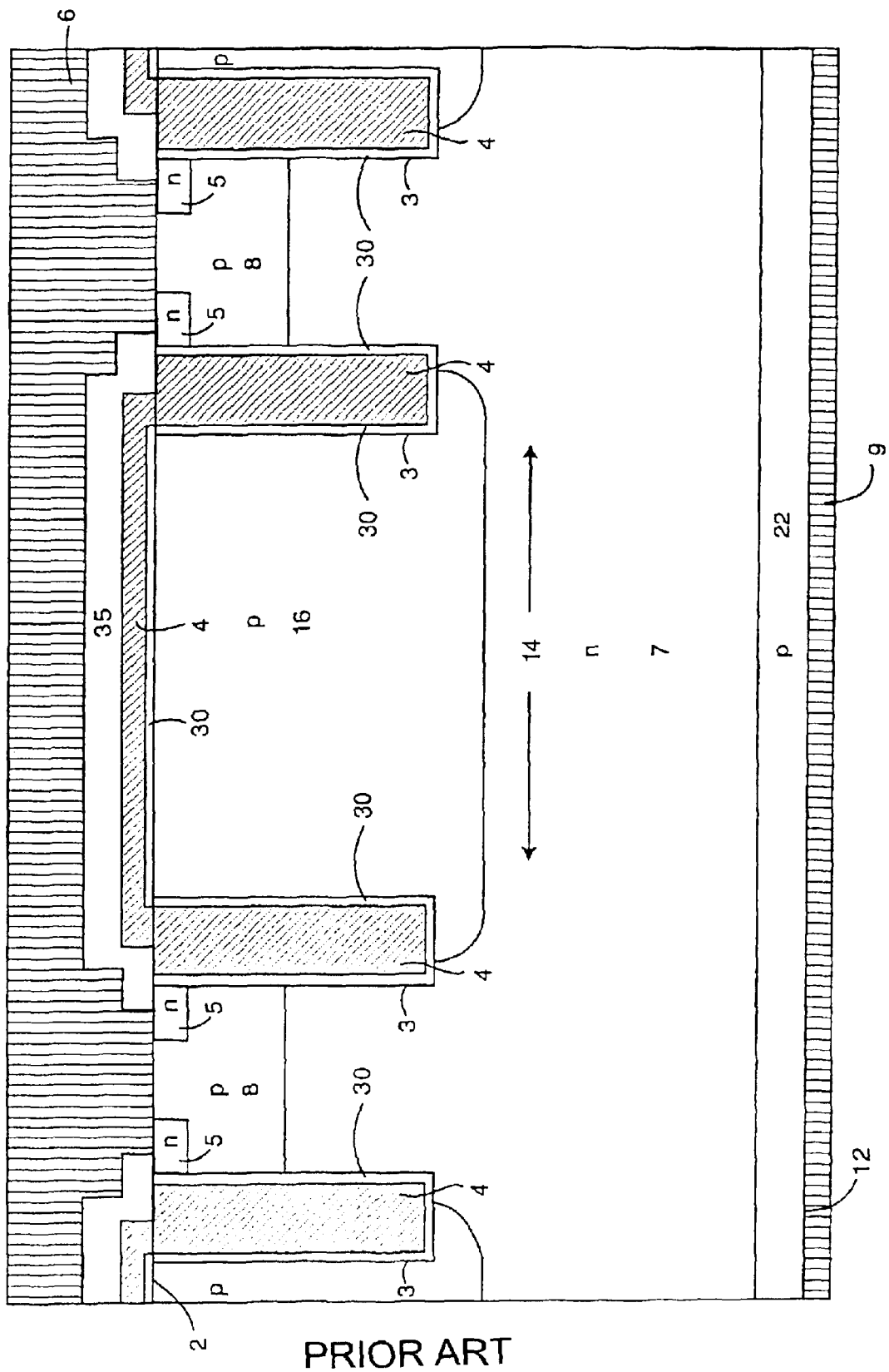
Figure 12:
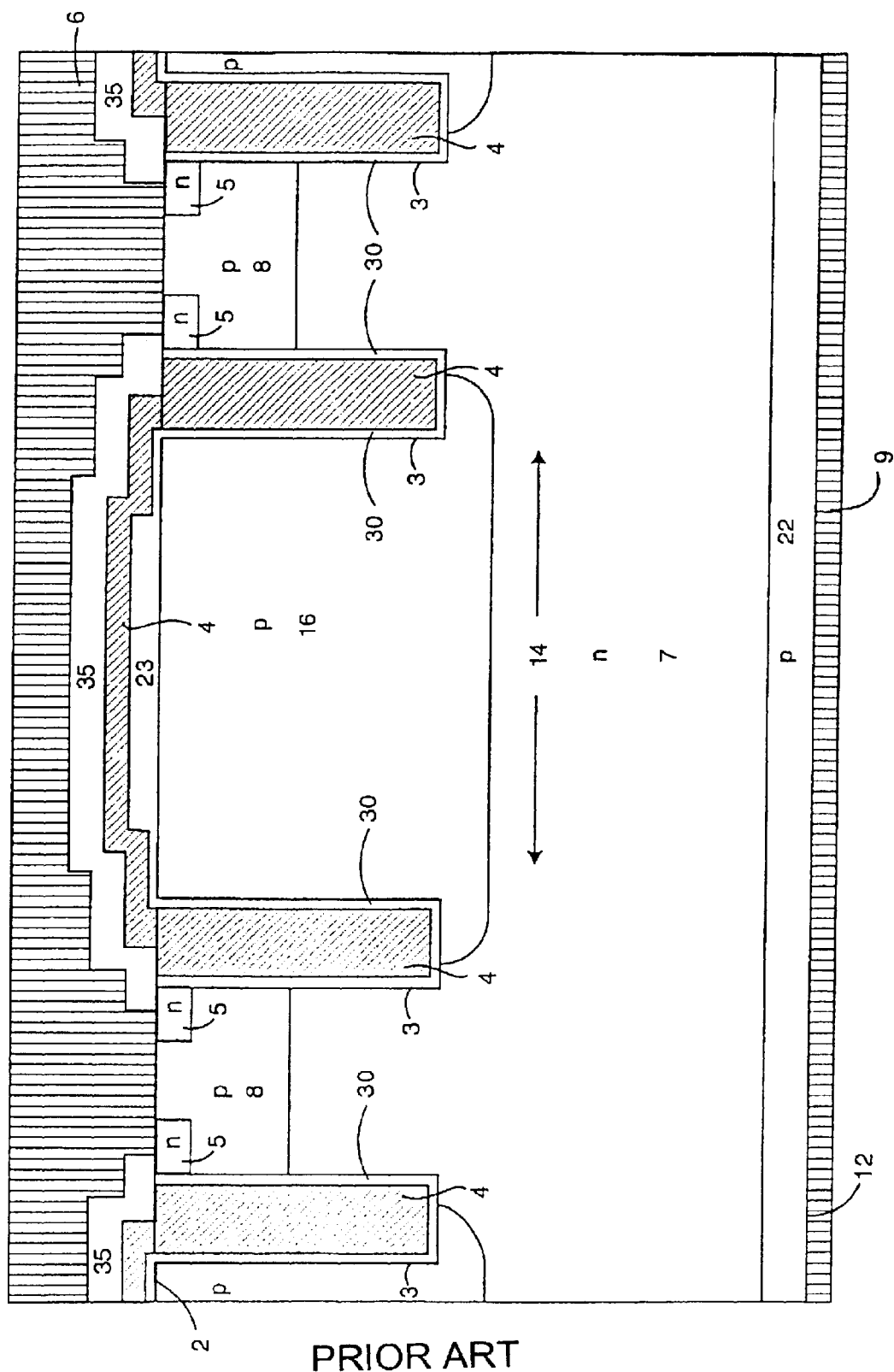

FIG. 4 shows a further exemplary embodiment of the power semiconductor component according to the invention having an IEGT, in a sectional view, and in this figure a further trench 17 with two electrodes 11 connected to source is provided in the intercell region 14, in a similar way in the conventional power semiconductor component shown in FIG. 9. Instead of the floating region 16 of the exemplary embodiment shown in FIG. 1 or of the exemplary embodiment shown in FIGS. 2, 3A and 3B, in this case, therefore, this additional trench 17 is present, so that the individual cells are not directly adjacent, but rather have a space between them, as has been explained above.

Instead of an additional trench 17 of this type, it is also possible to provide what is known as a wide trench 21 in the intercell region 14, as illustrated in the exemplary embodiment shown in FIG. 5. This wide trench 14 is likewise responsible for insuring the distance between the individual cells that is required in order to produce the narrow current path.

Figure 6A:
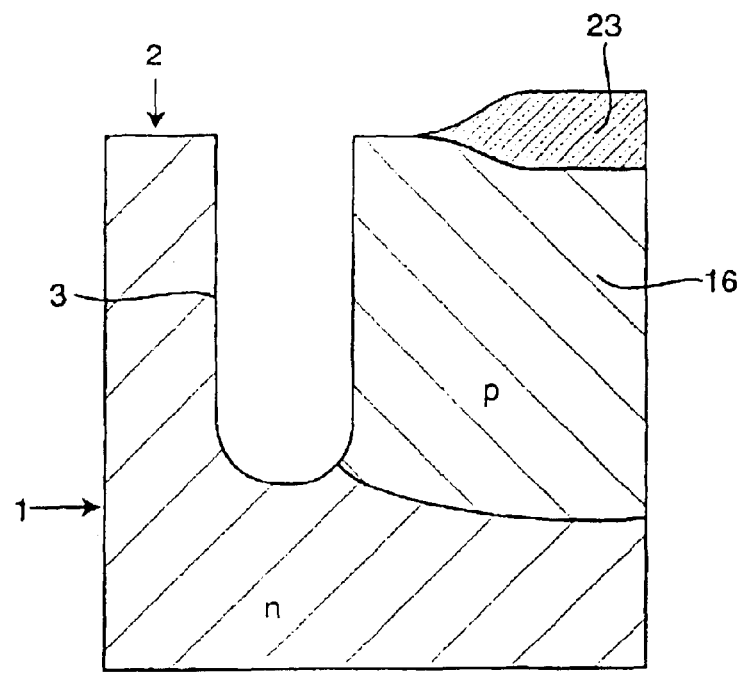
FIGS. 6A to 6H are sectional views showing the fabrication of a trench IGBT in accordance with a first exemplary embodiment of the method according to the invention.

Two different exemplary embodiments for fabrication of the power semiconductor component according to the invention will now be explained with reference to FIGS. 6A to 6H and 7A to 7E. These figures each represent sectional illustrations through a trench and the immediate vicinity thereof following individual fabrication steps.

a1) First of all, as shown in FIG. 6a, a patterned insulation layer 23 including, in particular, silicon dioxide, i.e. preferably a layer of silicon dioxide, is produced on or in a surface 2 of a semiconductor body 1. The patterning of this silicon dioxide layer 23 can take place in a customary way, for example with the aid of a photoresist layer and exposure of this layer or by using a LOCOS process. The silicon dioxide layer is preferably a field-oxide layer. This is then followed by the etching of a trench 3. Finally, it is optionally possible for a zone 16 that has a conductivity type that is opposite to the conductivity type of the semiconductor body 1 to be introduced into what will subsequently be an intercell region 14 (cf. FIGS. 1 and 2). In the present example, the semiconductor body 1 has n-type conductivity, and consequently p-type conductivity is provided for the zone 16. The zone 16 can be doped, for example, by ion implantation. Moreover, it is possible for the zone 16 to be doped by diffusion even before the silicon dioxide layer 23 has been produced. However, it is also possible to dispense with the zone 16 and for a further trench 17 (cf. FIG. 4) to be provided later in the intercell region or for the trench itself to be of wide configuration (cf. FIG. 5).

Figure 6B:
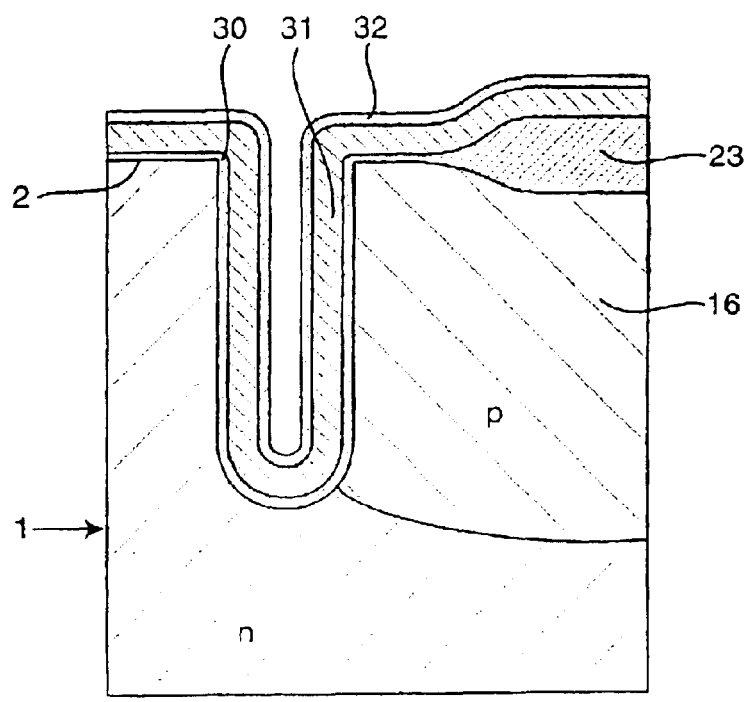

(b1) Then, as shown in FIG. 6B, a gate insulation layer 30, a polycrystalline silicon layer 31 and a silicon nitride layer 32 as the first layer of material are produced in this order on the uncovered surface 2 of the semiconductor body 1 and if appropriate the zone 8 and also in the trench 3 and if appropriate on the uncovered surface of the silicon dioxide layer 23. The poly-crystalline silicon layer 31 and the silicon nitride layer 32 are formed by deposition. As an alternative to silicon nitride, it is also possible for another material that is suitable for masking the polysilicon oxidation to be used for the first layer of material 32. Furthermore, it is possible for a thin silicon dioxide layer 39 (indicated by dashed lines in FIG. 6c) to be applied to the polycrystalline silicon layer 31 before the nitride deposition.

Figure 6C:
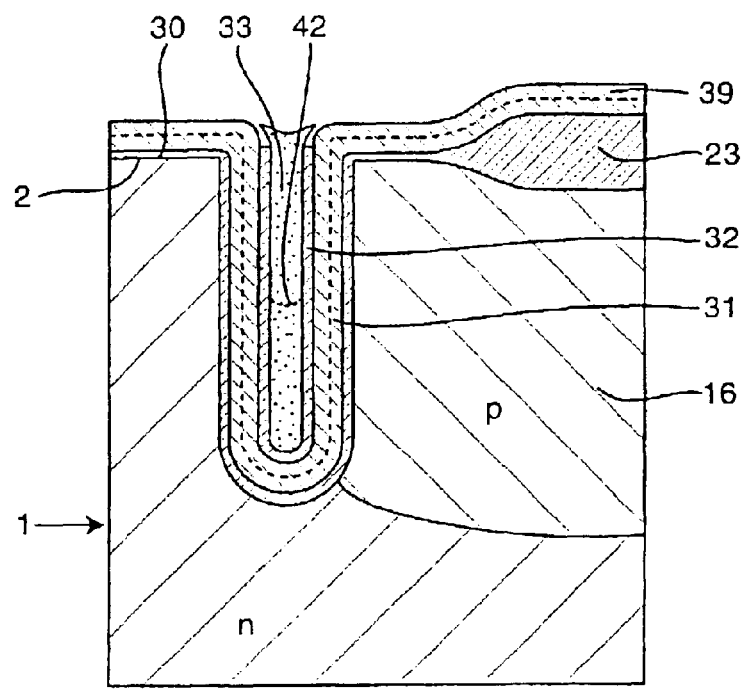

(c1) Then, a photoresist layer 33 as the second layer of material is applied over the entire surface and is etched back until the photoresist remains in place at least in the lower part of the trench 3 (cf. the dashed line 42). It is also possible for another material, which is suitable as a mask for the subsequent etching of the first layer of material, i.e. the silicon nitride layer 32, to be used instead of photoresist for the second layer of material. Then, the silicon nitride layer 32 is removed in the region which is not protected by the photoresist layer 33, i.e. on the surface and if appropriate in the upper part of the trench 3. FIG. 6C shows the structure that is obtained after the etching-back of the photoresist layer 33 and of the silicon nitride layer 32: the photoresist layer 33 remains as a plug in the trench 3. The silicon nitride layer 32 is also present in the trench 3 between the polycrystalline silicon layer 31 and the photoresist layer (the plug) 33. It is also possible for the photoresist layer 33 to be patterned in a customary way by exposure and subsequent developing.

Figure 6D:
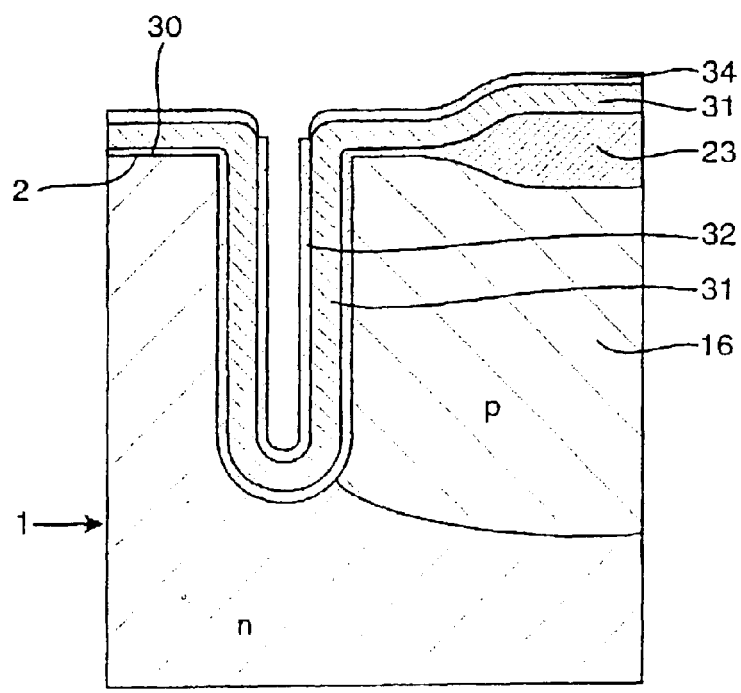

(d1) Then, as shown in FIG. 6D, the resist layer 33 or the plug of this resist layer which has remained in the trench 3 is removed, and the surface of the polycrystalline silicon layer 31 from which the silicon nitride layer 32 was removed, i.e. essentially the surface of the polycrystalline silicon layer 31 outside the trench, is oxidized. Therefore, a local oxidation, which is masked by the first layer of material at least in the lower part of the trench 3, of the polycrystalline silicon layer 31 is performed. This results in the formation of an insulation layer 34 of silicon dioxide substantially above the surface 2 of the semiconductor body 1 on the polycrystalline silicon layer 31. Therefore, the structure shown in FIG. 6D is present.

Figure 6E:
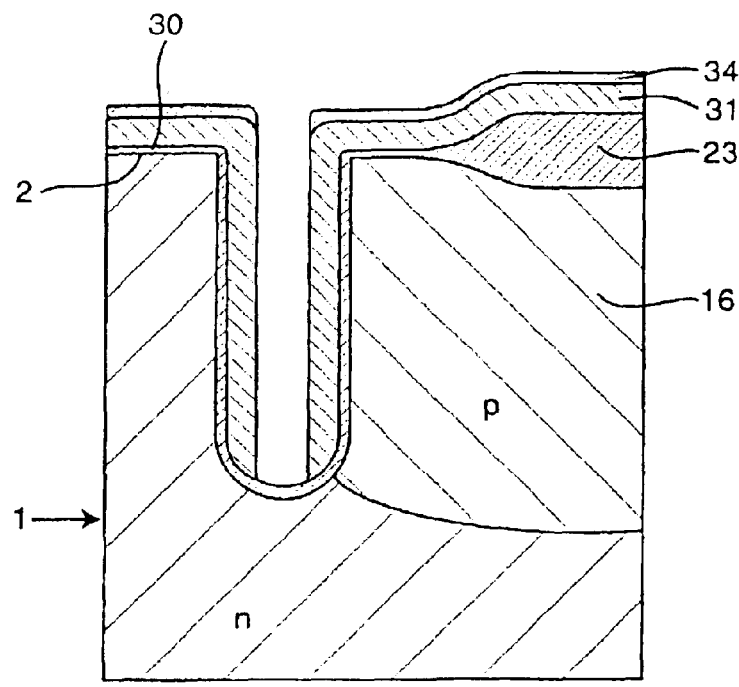

(e1) Then, as shown in FIG. 6E, the silicon nitride layer 32 in the trench can optionally be removed. However, it is also possible for the silicon nitride layer 32 to be left in the trench 3 at this point. At any rate, the polycrystalline silicon layer 31 is then anisotropically etched. The polycrystalline silicon layer 31 above the surface 2 remains substantially masked outside the trench 3 by the silicon dioxide layer 34. Then, if appropriate, first of all the silicon nitride layer 32 in the trench 3 is removed. The result is a structure in which the polycrystalline silicon layer 31 remains substantially only in the region of the walls of the trench 3 and above the surface 2, while the bottom of the trench 3 is covered by the gate insulation layer 30. Therefore, the structure illustrated in FIG. 6E is present.

(f1) Then, a thin insulation layer 37, of silicon dioxide or silicon nitride, i.e. a layer that does not fill the trench 3, is applied to the surface of the structure shown in FIG. 6E by oxidation or deposition. In the present example, it is assumed that this insulation layer 37 includes silicon dioxide. It therefore forms an integral unit with the silicon dioxide layer 34, which is therefore no longer shown separately in FIG. 6F. What this means is that, in FIG. 6F, the insulation layer 37 outside the trench that is provided above the surface 2 of the semiconductor body on the polycrystalline silicon layer 31 actually still includes the silicon dioxide layer 34. The insulation layer 37, in terms of its function, corresponds to the insulation layer 18 shown in FIG. 1 or 2. Then, the trench 3 is filled by a further polycrystalline silicon layer 38. This filling of the trench 3 can be effected by depositing polycrystalline silicon over the entire surface and then etching it back. The result is then the structure shown in FIG. 6F.

Figure 6F:
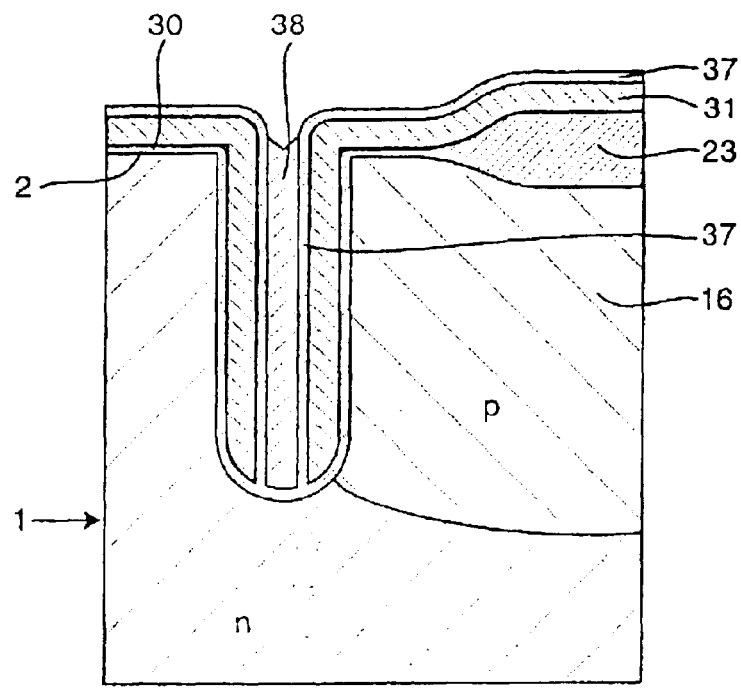
Figure 6G:
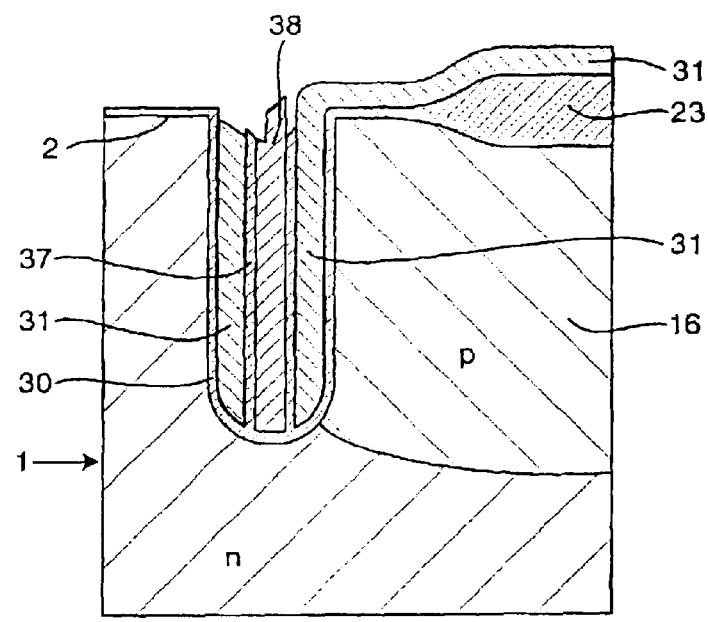

(g1) There follows a patterning of the polycrystalline silicon layer 31, in which this layer is removed, together with the silicon dioxide layer 37 provided thereon, for example by etching, substantially above what will subsequently be the body zone 8. The result is that the structure illustrated in FIG. 6G is obtained.

Figure 6H:
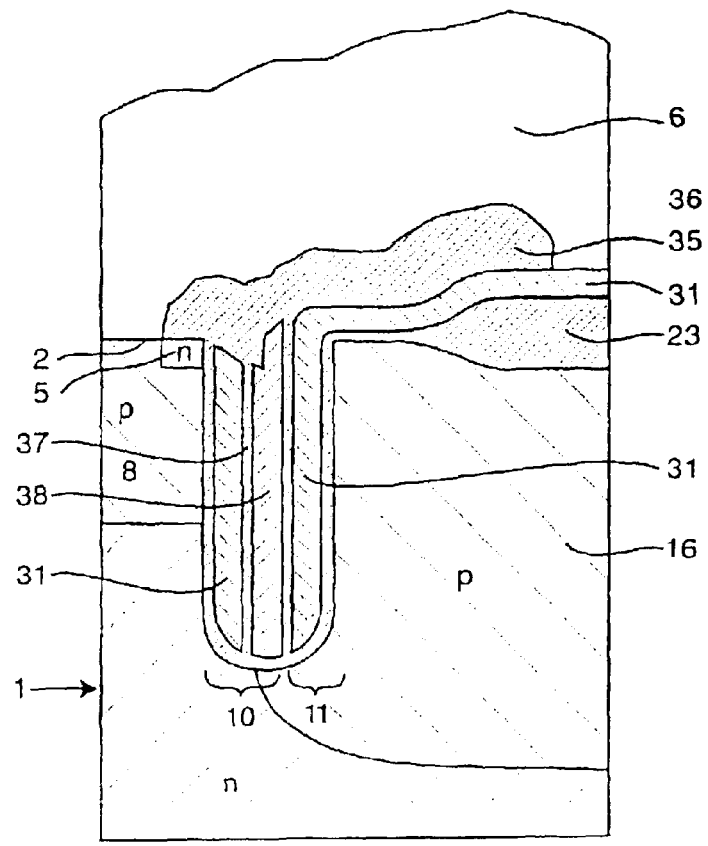

(h1) Then, the p-conducting body zone 8 is introduced into the surface of the semiconductor body 1 by implantation or diffusion. This implantation or fusion is optional at this time. This means that it may also be carried out at an earlier time. The same is also true of the production of the n-conducting source zone 5, which is then performed and which can likewise be introduced by implantation and diffusion, but preferably by implantation and subsequent annealing. Then, a further insulation layer 35 of silicon dioxide or BPSG (borophosphosilicate glass) is deposited. After contact holes 36 have been etched in this further insulation layer 35 and a source metallization 6 including aluminum, for example, has been applied, the structure illustrated in FIG. 6H is then present. It is optionally also possible for a trench etch into the semiconductor body 1 and the polycrystalline silicon layer 31 to be performed together with the etching of the contact holes 36.

The steps carried out following the deposition of the polycrystalline silicon layer 31 (cf. FIG. 6B) through to the removal of the silicon nitride layer 32 (cf. FIG. 6E), which make it possible to isolate the polycrystalline silicon for gate electrode 10 ("left-hand" polysilicon 31 and if appropriate polysilicon 38 in FIG. 6H) and source electrode ("right-hand" polysilicon 31 in FIG. 6H), are essential to this exemplary embodiment.

The following text explains a further exemplary embodiment of the invention with reference to FIGS. 7A to 7E. In these figures, components that correspond to one another are provided with the same reference numerals as in the exemplary embodiment shown in FIGS. 6A to 6H.

The starting point for this second exemplary embodiment of the invention is the structure of the first exemplary embodiment which is shown in FIG. 6E, i.e. a configuration that is obtained after the polycrystalline silicon layer 31 (cf. FIG. 6D) has been anisotropically etched following the optionally performed removal of the silicon nitride layer 32.

Figure 7A:
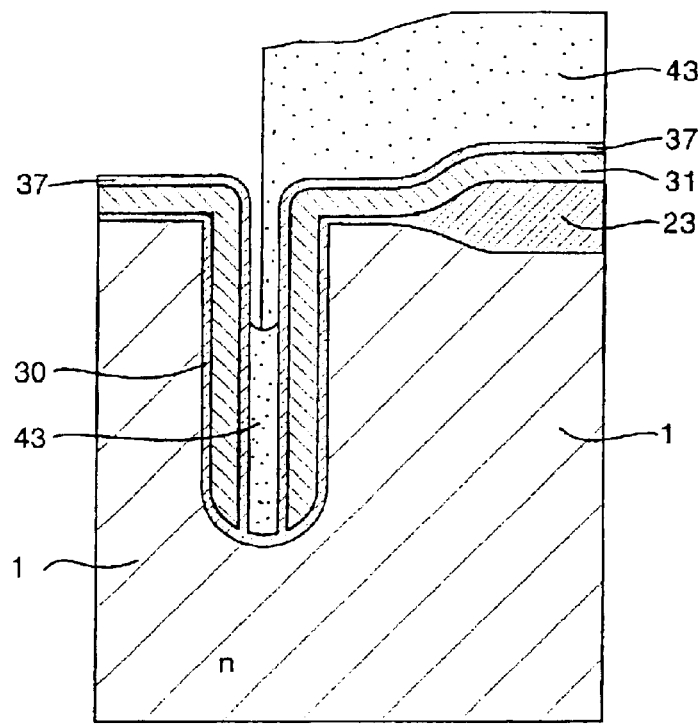
FIGS. 7A to 7E are sectional views showing a second exemplary embodiment of the method according to the invention.

(f2) First of all, in a similar way to that which has been explained with reference to FIG. 6F, the insulation layer 37 of silicon dioxide or silicon nitride is applied by oxidation or deposition. Then, a further layer, for example in the form of a photoresist layer 43, is applied and patterned in such a way that this photoresist layer 43 is removed on the cell side, i.e. on the left-hand side in FIG. 7A, which can be achieved, for example, by using a photographic technique. It is also possible for another suitable material to be used instead of a photoresist. Therefore, the structure shown in FIG. 7A is then present.

Figure 7B:
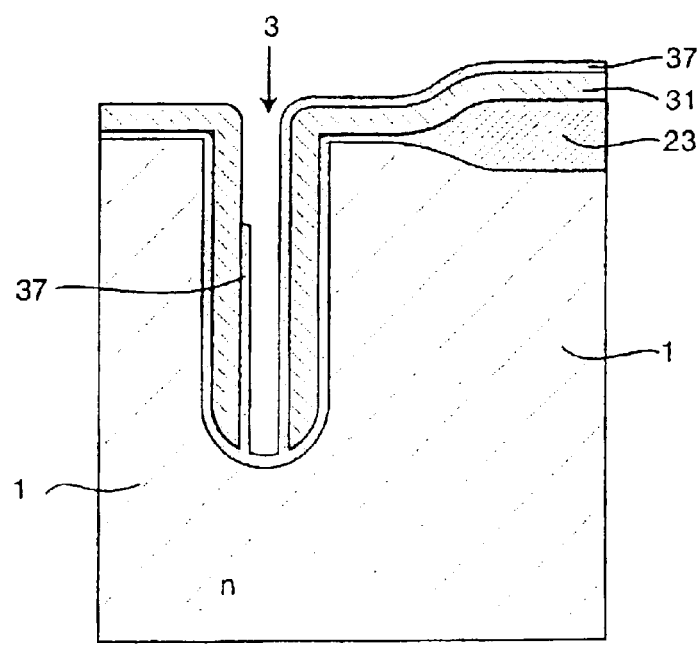

(g2) The regions of the insulation layer 37 that are not covered by the photoresist layer 43 are then removed, for example by etching. What this means is that this insulation layer 37 is removed on the cell side. In this way, the structure illustrated in FIG. 7B is obtained.

(h2) This is then followed by the deposition of the further polycrystalline silicon layer 38 which is used to fill the trench 3 and to connect the gate to a gate contact. Therefore, the structure shown in FIG. 7C, in which the polycrystalline silicon layer 38 is still filling the remaining trench 3 (cf. FIG. 7B) and in addition is provided above the surface 2 of the semiconductor body 1 on the insulation layer 37 (right-hand half of FIG. 7C) and on the polycrystalline silicon layer 31 (left-hand half of FIG. 7C), is then present. In this left-hand half, the polycrystalline silicon layer 31 and the further polycrystalline silicon layer 38 form a common layer. The result, therefore, is the structure illustrated in FIG. 7C.

Figure 7C:
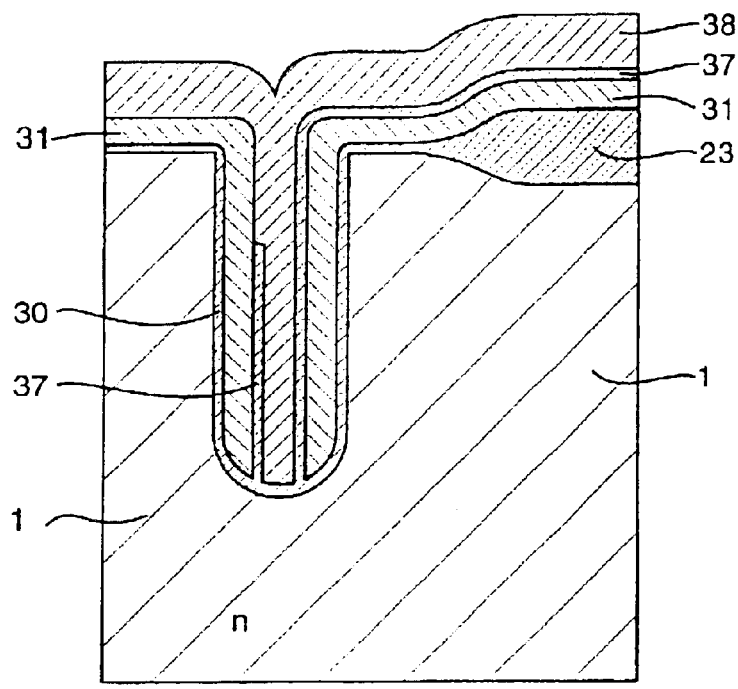
Figure 7D:
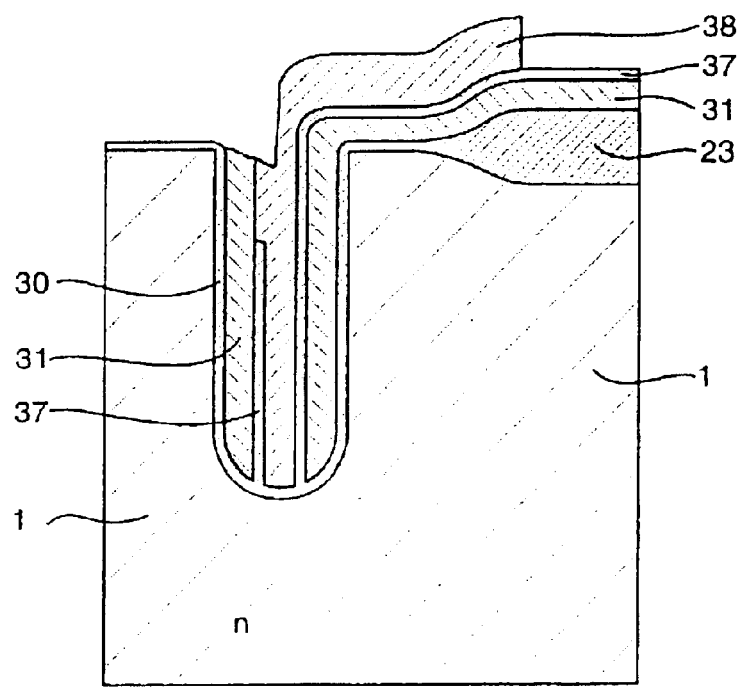

(i2) This is then followed by patterning of the polycrystalline silicon layer 38, during which this layer is substantially removed on the cell side, i.e. on the left-hand side in FIG. 7C. During this removal, that part of the polycrystalline silicon layer 31, which lies below the polycrystalline silicon layer 38, is also removed. It is also possible for the polycrystalline silicon layer 38 to be removed in a region above the insulation layer 23. This removal of the polycrystalline silicon layer 38 and the polycrystalline silicon layer 31 provided beneath it can be carried out by using the standard photoresist and etching techniques. The structure illustrated in FIG. 7D is then present following this polysilicon patterning.

Figure 7E:
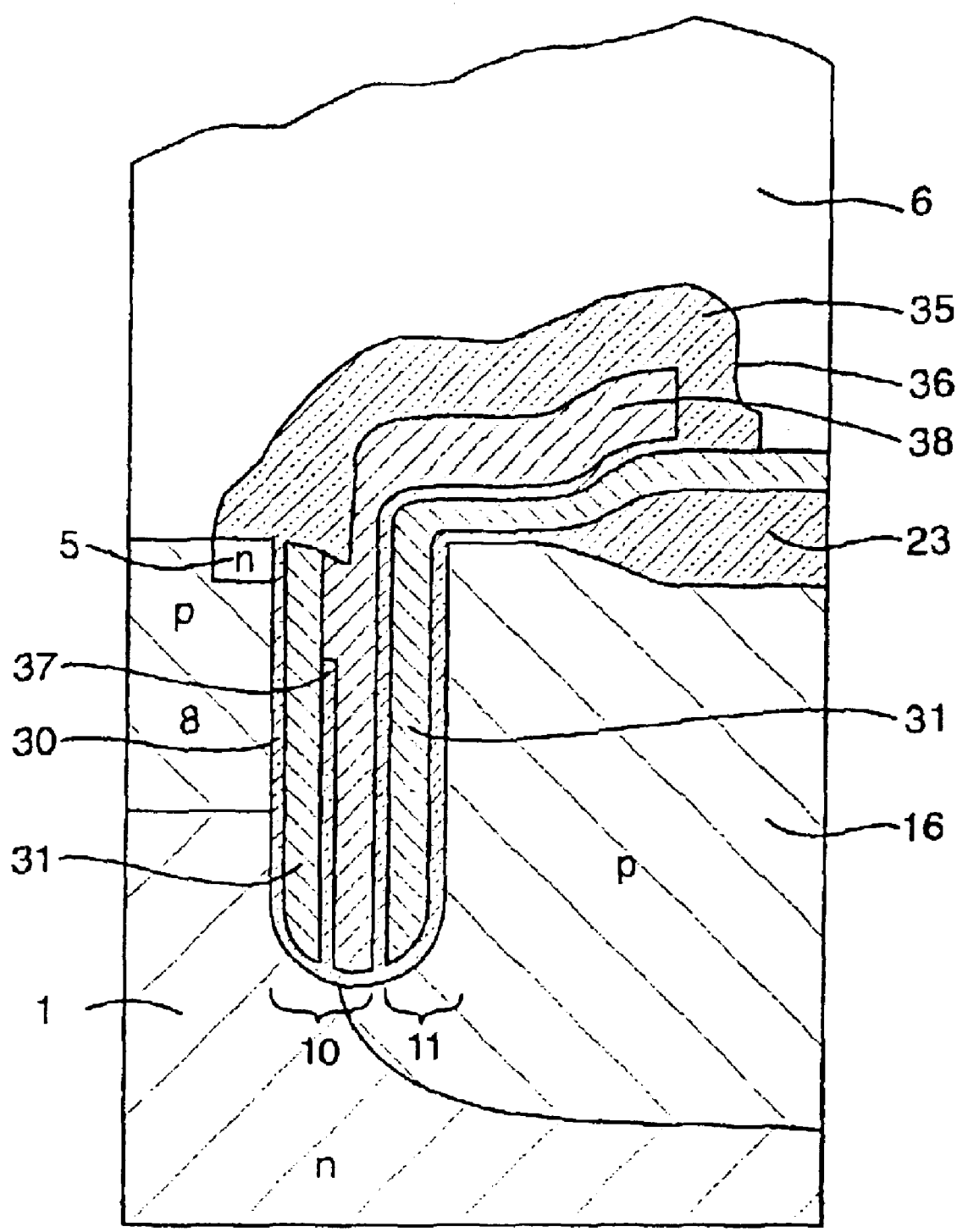
Figure 8:
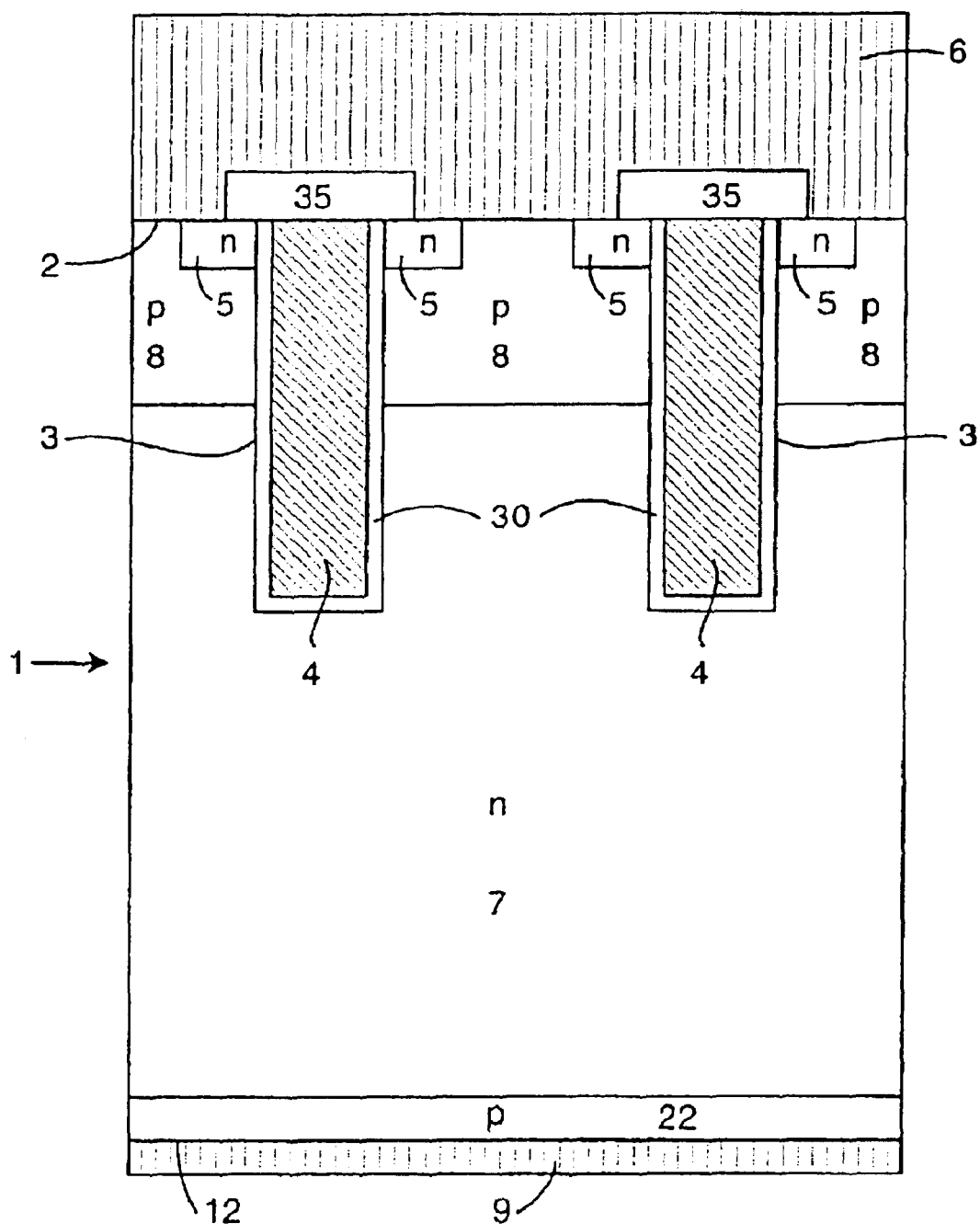
FIG. 8 is a sectional view through a prior-art trench IGBT.

(j2) This is then followed by similar steps to those which have been explained above in section (h1): introduction of the p-conducting body zone 8 by implantation or diffusion, although this is also possible at a different time, introduction of the n-conducting source zone 5 by diffusion or implantation, preferably by implantation with subsequent annealing, although all of this is also possible at a different time, deposition of an intermediate oxide as further insulation layer 35, etching of contact holes 36 into this further insulation layer 35, and application of the source metallization 6, so that the structure shown in FIG. 7E is created. In this exemplary embodiment 2, it is also possible for trench etches into the silicon of the semiconductor body 1 and through the polycrystalline silicon layer 31 to be performed together with the contact holes 36.

An advantage of this second exemplary embodiment is that the second polycrystalline silicon layer 38, which is used to fill the trench, is additionally used for connection of the gate electrode. In this case, the second polycrystalline silicon layer 38 is conductively connected to the first polycrystalline silicon layer 31 on the left-hand side in the trench 3.

We claim:

1. A power semiconductor component, comprising:
   a semiconductor body having a surface with a trench formed therein, said trench having a lower region;
   an electrode device provided in said trench and having two electrodes electrically isolated from one another;
   a first semiconductor zone of a first conductivity type, adjoining said trench, and having a metallization provided on said surface of said semiconductor body;
   a second semiconductor zone of said first conductivity type and adjoining said lower region of said trench; and
   a third semiconductor zone of a second conductivity type opposite to said first conductivity type, adjoining said trench, and separating said first semiconductor zone from said second semiconductor zone.

2. The power semiconductor component according to claim 1, further comprising a gate electrode connected to a first of said electrodes; a second of said electrodes being connected to said metallization.

3. The power semiconductor component according to claim 2, wherein said first of said electrode extends at least as deep as said second semiconductor zone.

4. The power semiconductor component according to claim 3, wherein:
   said trench has a bottom; and
   said first of said electrode extends as far as said bottom of said trench.

5. The power semiconductor component according to claim 1, wherein said first semiconductor zone adjoins said surface.

6. The power semiconductor component according to claim 1, wherein said semiconductor body has a further surface opposing said surface of said semiconductor body; a further metallization provided on said further surface.

7. The power semiconductor component according to claim 1, wherein said two electrodes of said electrode device are mutually adjacent.

8. The power semiconductor component according to claim 1, wherein:
   said semiconductor body has an intercell region; and
   a first of said electrodes of said electrode device is contacted to said metallization and includes a section overlapping said intercell region.

9. The power semiconductor component according to claim 8, wherein said first of said electrodes is connected to said metallization in said intercell region.

10. The power semiconductor component according to claim 1, further comprising a gate connection being connected to a first of said electrodes of said electrode device; a second of said electrodes being connected to said metallization; said first of said electrodes including a section at least partially overlapping said second of said electrodes.

11. The power semiconductor component according to claim 1, wherein:
    said semiconductor body has an intercell region; and
    said electrode device is at least partly configured in step form over said intercell region.

12. The power semiconductor component according to claim 1, wherein said trench and said electrode device have a strip structure.

13. The power semiconductor component according to claim 12, wherein:
    said strip structure has a strip end; and
    a gate connection is disposed at said strip end.

14. The power semiconductor component according to claim 1, wherein said trench and said electrode device laterally surround said third semiconductor zone.

15. The power semiconductor component according to claim 14, wherein said third semiconductor zone has a polygon shape when seen from above.

16. The power semiconductor component according to claim 15, wherein said polygon shape is selected from the group consisting of a square and a hexagon.

17. The power semiconductor component according to claim 1, wherein said semiconductor body has an intercell region with a floating region.

18. The power semiconductor component according to claim 17, wherein said floating region has said second conductivity type.

19. The power semiconductor component according to claim 1, wherein said semiconductor body has an intercell region and a further trench in said intercell region.

20. The power semiconductor component according to claim 1, further comprising a connection separate from a gate connection and said metallization and connected to one of said electrodes of said electrode device.

21. The power semiconductor component according to claim 1, further comprising an insulation layer isolating said electrodes of said electrode device and being selected from the group consisting of silicon dioxide, silicon nitride, and a plurality of films with at least one of said films being silicon nitride.

22. The power semiconductor component according to claim 1, wherein:
    said semiconductor body has an intercell region:
    a first of said electrodes has a width; and
    said trench forms a wide trench spanning said intercell region and having a width greater than said first of said electrodes.

23. The power semiconductor component according to claim 6, wherein at least one of said metallization is made of aluminum.

24. The power semiconductor component according to claim 1, wherein said metallization is made of aluminum.

25. The power semiconductor component according to claim 1, wherein said electrode device is made of polycrystalline silicon.

26. An IGBT, comprising:
    A semiconductor body having a surface with a trench formed therein, said trench having a lower region;
    an electrode device provided in said trench and having two electrodes electrically isolated from one another;
    a first semiconductor zone of a first conductivity type, adjoining said trench, and having a metallization provided on said surface of said semiconductor body;
    a second semiconductor zone of said first conductivity type and adjoining said lower region of said trench; and
    a third semiconductor zone of a second conductivity type opposite to said first conductivity type, adjoining said trench, and separating said first semiconductor zone from said second semiconductor zone.

27. An IEBT, comprising:
    a semiconductor body having a surface with a trench formed therein, said trench having a lower region;
    an electrode device provided in said trench and having two electrodes electrically isolated from one another;
    a first semiconductor zone of a first conductivity type, adjoining said trench, and having metallization provided on said surface of said semiconductor body;

a second semiconductor zone of said first conductivity type and adjoining said lower region of said trench; and a third semiconductor zone of a second conductivity type opposite to said first conductivity type, adjoining said trench, and separating said first semiconductor zone from said second semiconductor zone.

28. A field-effect transistor, comprising:

a semiconductor body having a surface with a trench formed therein, said trench having a lower region;

an electrode device provided in said trench and having two electrodes electrically isolated from one another;

a first semiconductor zone of a first conductivity type, adjoining said trench, and having a metallization provided on said surface of said semiconductor body;

a second semiconductor zone of said first conductivity type and adjoining said lower region of said trench; and a third semiconductor zone of a second conductivity type opposite to said first conductivity type, adjoining said trench, and separating said first semiconductor zone from said second semiconductor zone.

* * * * *